US011522024B2

(12) United States Patent
Zhang et al.

(10) Patent No.: US 11,522,024 B2
(45) Date of Patent: Dec. 6, 2022

(54) DISPLAY SCREEN

(71) Applicant: Vkansee (Beijing) Technology Co., Ltd., Beijing (CN)

(72) Inventors: Mingfang Zhang, Beijing (CN); Yuanjing Wang, Beijing (CN); Qingwen Liu, Beijing (CN)

(73) Assignee: Vkansee (Beijing) Technology Co., Ltd., Beijing (CN)

( * ) Notice: Subject to any disclaimer, the term of this patent is extended or adjusted under 35 U.S.C. 154(b) by 597 days.

(21) Appl. No.: 16/305,273

(22) PCT Filed: May 9, 2017

(86) PCT No.: PCT/CN2017/083607
§ 371 (c)(1),
(2) Date: Nov. 28, 2018

(87) PCT Pub. No.: WO2017/206676
PCT Pub. Date: Dec. 7, 2017

(65) Prior Publication Data
US 2020/0127066 A1 Apr. 23, 2020

(30) Foreign Application Priority Data

May 30, 2016 (CN) .......................... 201610367136.5
Feb. 17, 2017 (CN) .......................... 201710086890.6

(51) Int. Cl.
*H01L 27/32* (2006.01)
*H01L 51/52* (2006.01)
*H01L 31/173* (2006.01)

(52) U.S. Cl.
CPC ........ *H01L 27/3234* (2013.01); *H01L 31/173* (2013.01); *H01L 51/5271* (2013.01); *H01L 51/5275* (2013.01)

(58) Field of Classification Search
None
See application file for complete search history.

(56) References Cited

U.S. PATENT DOCUMENTS 5,726,443 A 3/1998 Immega et al.
7,936,983 B2 * 5/2011 Konno ................. G06V 10/141
396/14

(Continued)

FOREIGN PATENT DOCUMENTS

CN 1381810 A 11/2002
CN 101661555 A 3/2010

(Continued)

OTHER PUBLICATIONS

Partial European Search Report dated Dec. 17, 2019, for European Patent Application No. 17805621.4, 14 pages.

(Continued)

*Primary Examiner* — Evren Seven
(74) *Attorney, Agent, or Firm* — Bret E. Field; Bozicevic, Field & Francis LLP

(57) ABSTRACT

A display screen, comprising a panel (1), a light-emitting plate (2), a light blocking film (3) and an image sensor (4) that are stacked sequentially. The light blocking film (3) is provided with a light-transmitting imaging pinhole (31); the light-emitting plate (2) is provided with a plurality of light-emitting units (21) and a circuit network (22) for driving each of the light-emitting units (21), wherein the circuit network (22) divides the light-emitting plate (2) into a plurality of light-transmitting regions (23), and a light path is formed by the panel (1), the light-transmitting region (23) corresponding to a position of the imaging pinhole and the imaging pinhole (31); alternatively, the light-emitting plate (2) is a plane light-emitting plate which is light-transmissive, and a light path is formed by the panel (1), the plane light-emitting plate and the imaging pinhole (31); and a part (Continued)

of light projected by the light-emitting plate (2) toward the panel (1) is reflected by a target object located on or outside the panel (1), and then irradiated onto the image sensor (4) through the light path. According to the principle of pinhole imaging, the light passing through the imaging pinhole (31) can image on the image sensor (4), thereby enabling the display screen to have both a display function and an image acquisition function.

11 Claims, 8 Drawing Sheets

(56) References Cited

U.S. PATENT DOCUMENTS

| | | |
|---|---|---|
| 2004/0252867 A1 | 12/2004 | Lan et al. |
| 2008/0317303 A1 | 12/2008 | Konno et al. |
| 2010/0117076 A1 | 5/2010 | Akimoto et al. |
| 2012/0242884 A1* | 9/2012 | Ishiguro ............ H01L 27/14627 348/340 |
| 2015/0310249 A1* | 10/2015 | Ishiguro ................ H01L 31/173 257/84 |
| 2015/0331508 A1 | 11/2015 | Nho et al. |

FOREIGN PATENT DOCUMENTS

| | | |
|---|---|---|
| CN | 201498007 U | 6/2010 |
| CN | 204463158 U | 7/2015 |
| CN | 205910951 U | 1/2017 |
| JP | 2005-037930 A | 2/2005 |
| JP | 2009-003821 A | 1/2009 |
| JP | 2010-049664 A | 3/2010 |
| WO | WO2015192630 A1 | 12/2015 |

OTHER PUBLICATIONS

European Search Report dated Feb. 27, 2020, for European Patent Application No. 17805621.4, 17 pages.

* cited by examiner

DISPLAY SCREEN

CROSS-REFERENCE TO RELATED APPLICATION

The present application claims the benefit of Chinese Patent Application No. 201610367136.5 entitled "DISPLAY SCREEN", filed with China National Intellectual Property Administration on May 30, 2016, and Chinese Patent Application No. 201710086890.6 entitled "DISPLAY SCREEN", filed with China National Intellectual Property Administration on Feb. 17, 2017, which are incorporated herein by reference in their entirety.

FIELD OF THE INVENTION

The present application relates to the field of display device technologies, and in particular, to a display screen having both a display function and an image acquisition function.

BACKGROUND OF THE INVENTION

In order to ensure the security of locking/unlocking as well as facilitate device wake-up, a lot of terminal devices, such as intelligent mobile phones, are equipped with a fingerprint acquisition apparatus for acquiring fingerprint information input by a user. According to different fingerprint acquisition mechanisms, capacitive fingerprint acquisition apparatus and optical fingerprint acquisition apparatus have been developed.

FIG. 1 is a schematic structural diagram of an existing optical fingerprint acquisition apparatus based on the principle of matrix pinhole imaging. As shown in FIG. 1, the optical fingerprint acquisition apparatus includes a light guide plate 01, a light source 02, an imaging layer 03 and an image sensor 05; the imaging layer 03 has a plurality of imaging holes 04 distributed in an array; the light source 02 is provided at a side of the light guide plate 01, and a part of the light emitted by the light source 02 may be transmitted in the light guide plate 01 in a total internal reflection manner; the imaging layer 03 is substantially parallel to the light guide plate 01 and the image sensor 05, and is located between the light guide plate 01 and the image sensor 05.

The optical fingerprint acquisition apparatus described above is an independent apparatus having only a function of fingerprint image acquisition. If it is equipped on the front face of a terminal device requiring screen display, for example, a mobile phone, it will inevitably occupy the space of a limited size. The design of the front screen of an intelligent mobile phone is evolving to large display region and narrow frame, which often cannot provide an independent space large enough for installing a fingerprint acquisition apparatus. Therefore, as required by practical application, it has become an urgent problem to those skilled in the art how to realize a fingerprint acquisition function in designing a mobile phone screen with large display region and narrow frame.

SUMMARY OF THE INVENTION

In order to solve the problem that the fingerprint acquisition apparatus and the display screen of the existing terminal device need to be equipped in parallel and occupy a large space, the present application provides a display screen having both a display function and an image acquisition function.

The present application provides a display screen, which includes a panel, a light-emitting plate, a light blocking film and an image sensor that are stacked sequentially; wherein, the light blocking film is provided with a light-transmitting imaging pinhole; the light-emitting plate is provided with a plurality of light-emitting units and a circuit network for driving each of the light-emitting units, wherein the circuit network divides the light-emitting plate into a plurality of light-transmitting regions, and a light path is formed by the panel, the light-transmitting region corresponding to a position of the imaging pinhole and the imaging pinhole; or, the light-emitting plate is a plane light-emitting plate which is light transmissive, and a light path is formed by the panel, the plane light-emitting plate and the imaging pinhole; and a part of light projected by the light-emitting plate toward the panel is reflected by a target object located on or outside the panel, and then irradiated onto the image sensor through the light path.

Preferably, a region of the light-emitting plate corresponding to an FOV angle of the imaging pinhole does not emit light.

Preferably, the display screen further includes a light-transmitting substrate provided between the light blocking film and the image sensor.

Preferably, the display screen further includes a low-refractive index light-transmitting layer provided between the light-transmitting substrate and the image sensor.

Preferably, the light blocking film is provided with a plurality of the imaging pinholes; an image-side FOV angle of each of the imaging pinholes is $2\alpha$; a distance between the centers of adjacent imaging pinholes is d; a distance from a imaging surface of the image sensor to the light blocking film is h; where $d \geq 2h \tan \alpha$.

The present application provides another display screen, which includes a panel, a light-emitting plate and an image sensor that are stacked; wherein a side of the light-emitting plate facing the image sensor is light-tight; an imaging pinholes which is light-transmissive is provided on the side of the light-emitting plate facing the image sensor; the light-emitting plate has a plurality of light-emitting units, or, the light-emitting plate is light emissive by an area thereof; and a part of light projected by the light-emitting plate toward the panel is reflected by a target object located on or outside the panel, and then is irradiated onto the image sensor through a light path formed by the panel and the imaging pinhole.

Preferably, a region of the light-emitting plate corresponding to an FOV angle of the imaging pinhole does not emit light.

Preferably, the display screen further includes a light-transmitting substrate provided between the light-emitting plate and the image sensor.

Preferably, the display screen further includes a low-refractive index light-transmitting layer provided between the light-transmitting substrate and the image sensor.

Preferably, the light blocking film is provided with a plurality of the imaging pinholes; and an image-side FOV angle of each of the imaging pinholes is $2a$; a distance between the centers of adjacent imaging pinholes is d; and a distance from a imaging surface of the image sensor to the light blocking film is h; where $d \geq 2h \tan \alpha$.

For the above display screen provided by the present application, one or more imaging pinholes are provided between the light-emitting plate and the image sensor, and the light emitted by the light-emitting plate toward the panel may be reflected and then pass through the imaging pinhole.

According to the principle of pinhole imaging, the light passing through the imaging pinhole may image on a photoelectric imaging unit, thereby enabling the display screen to have both a display function and an image acquisition function.

The present application further provides a display screen, which includes a panel and a light-emitting plate that are stacked, and further includes a narrow-FOV pixel image sensor provided at a side of the light-emitting plate; wherein, the narrow-FOV-pixel image sensor has imaging pixels each having a FOV angle less than 15°; the light-emitting plate is provided with a plurality of light-emitting units and a circuit network for driving each of the light-emitting units; the light-emitting plate are separated into a plurality of light-transmitting regions by the circuit network; and a light path is formed by the panel and the light-transmitting region; or, the light-emitting plate is a plane light-emitting plate which is light-transmissive, and a light path is formed by the panel and the plane light-emitting plate; and a part of light projected by the light-emitting plate toward the panel is reflected by a target object located on or outside the panel, and then irradiated onto the narrow-FOV pixel image sensor through the light path.

Preferably, a light blocking film, a transparent material layer and microlenses are provided sequentially on a side of the imaging pixels of the narrow-FOV pixel image sensor; the light blocking film is provided with a light-transmitting pinhole corresponding to each microlens; the FOV angle of the imaging pixel is constrained as less than 15° by the microlens, the transparent material layer and the light-transmitting pinhole; a low-refractive index light-transmitting layer with a refractive index lower than that of the microlenses is provided between the microlenses and the light-emitting plate; and light emitted by the light-emitting plate is reflected by a target object located on or outside the panel, passes through the light path, the low-refractive index light-transmitting layer, the microlens, the transparent material layer and the light-transmitting pinhole successively, and then is irradiated onto the imaging pixels.

Preferably, the narrow-FOV pixel image sensor has a light-blocking plate is provided between the light-emitting plate and the imaging pixels; the light-blocking plate is provided with light-transmitting holes; the thickness x of the light-blocking plate and the diameter y of the light-transmitting hole meet $$2\arctan\frac{y}{x} \leq 15°;$$

and light emitted by the light-emitting plate is reflected by a target object located on or outside the panel, passes through the light path and the light-transmitting hole successively, and then is irradiated onto the imaging pixels.

Preferably, the narrow-visual field pixel image sensor further includes a light guide fiber provided between the light-emitting plate and the imaging pixel; an endface receiving angle of the light guide fiber is less than 15°; and light rays emitted by the light-emitting plate are reflected by a target object located on or outside the panel and then irradiated onto the imaging pixel after passing through the light path and the light guide fiber successively.

For the above display screen provided the present application, the light emitted by the light-emitting plate toward the panel may be reflected, pass through the light-transmitting region on the light-emitting plate, and then be irradiated onto the imaging pixel of the narrow-FOV pixel image sensor for imaging, thus the display screen may also have both a display function and an image acquisition function.

BRIEF DESCRIPTION OF THE DRAWINGS

In order to describe the technical solutions of the present application or the prior art more clearly, the drawings used in the description of the embodiments or the prior art will be briefly described below. Apparently, the drawings used in the embodiments below are only provided for convenience of understanding the embodiments of the present application, and other drawings may also be obtained by one of ordinary skill in the art according to these drawings without creative work.

DETAILED DESCRIPTION OF THE EMBODIMENTS

The technical solutions in the embodiments of the present application will be described in detail below in conjunction with the drawings in the embodiments of the present application.

First Embodiment

Figure 1:
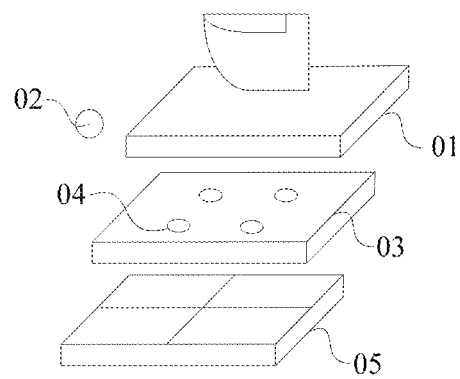
FIG. 1 is a schematic structural diagram of an existing optical fingerprint acquisition apparatus based on the principle of matrix pinhole imaging.
Figure 2:
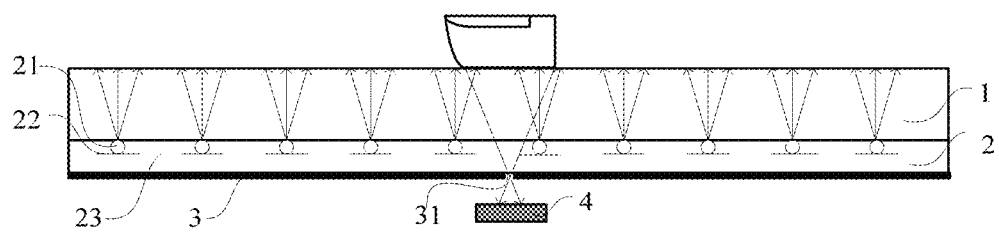
FIG. 2 is a schematic sectional view of the display screen in the first embodiment.

FIG. 2 is a schematic sectional view of the display screen in a first embodiment. As shown in FIG. 2, the display screen in the first embodiment includes a panel 1, a light-emitting plate 2, a light blocking film 3 and an image sensor 4, which are stacked sequentially. Wherein, the panel 1 is a light-transmitting panel; the light-emitting plate 2 has a plurality of light-emitting units 21 and a circuit network 22 for driving the respective light-emitting units 21, the light emitted by the light-emitting unit 21 transmits in directions toward the panel 1; the light-emitting plate 2 is separated into a plurality of light-transmitting regions 23 by the circuit network 22; the light blocking film 3 is provided with an imaging pinhole 31; a light path is formed by the panel 1, the light-transmitting region 23 corresponding to the position of the imaging pinhole and the imaging pinhole 31; the position of the image sensor 4 corresponds to the imaging pinhole 31.

Figure 3:
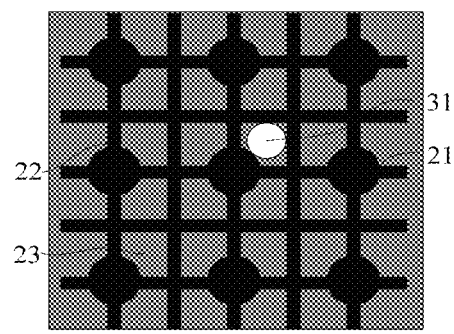
FIG. 3 is a planar schematic structural diagram of a light-emitting plate in the display screen of the first embodiment.

FIG. 3 is a planar schematic structural diagram of a light-emitting plate in the display screen of the first embodiment. As shown in FIG. 3, the circuit network 22 in the light-emitting plate 2 is of a grid-like shape and divide the light-emitting plate 2 into a plurality of light-transmitting regions 23, and the imaging pinhole 31 in the light blocking film 3 is provided on the lower side of the light-emitting plate 2.

In this embodiment, the body of the light-emitting plate 2 is a transparent plate, and an opaque circuit network 22 is stacked on the body and divides the body into a plurality of light-transmitting regions 23.

For a display screen employing the above structure, the light emitted by the light-emitting unit 21 projects in directions toward the panel 1, if there is a target object on the upper side of the panel 1, a part of the light will be reflected by the target object to re-enter the panel 1, and irradiated on the image sensor 4 after passing through the light path formed by the panel 1, the light-transmitting region 23 and the imaging pinhole 31. According to the principle of pinhole imaging, an inverted image of the target object is formed on the image sensor 4 by the reflected light passing through the imaging pinhole 31, and is then converted, by the image sensor 4, into digital image information of the target object.

In this embodiment, the light-emitting unit 21 may be an organic light-emitting diode (OLED). In normal use, the respective OLEDs are controlled by the circuit network 22 to be in different light-emitting states to form an image. When a target object moves onto the panel 1 and is detected by the display screen, the circuit network 22 controls the respective OLEDs to switch into respective preset light-emitting states. The light emitted by the respective OLEDs is reflected by different parts of the target object to form reflected light, and the reflected light passes through the light path and then is irradiated the image sensor 4 for imaging, so that the display screen can acquire an target object image acquisition.

It should be noted that, for the switching of the respective OLEDs into preset light-emitting states, it can indicate that all of the OLEDs emit light, or only a part of the OLEDs emit light. If only a part of the OLEDs emit light, the OLEDs emitting light are preferably distributed uniformly in the whole region, so that the intensity of the light projected to each part of the target object will be substantially uniform, so that it may be avoided that the image quality is reduced due to nonuniform illumination.

Second Embodiment

Figure 4:
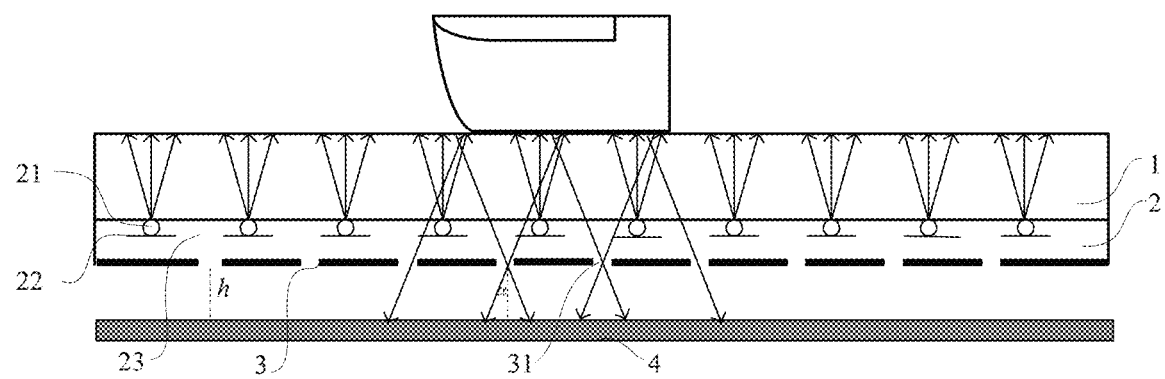
FIG. 4 is a schematic sectional view of a display screen shown in the second embodiment.

FIG. 4 is a schematic sectional view of a display screen in a second embodiment. The structure of the display screen in the second embodiment is roughly the same as that in the first embodiment, except that the light blocking film 3 has a plurality of imaging pinholes 31, and a light path is formed by each of the imaging pinholes 31 in combination with the corresponding region of the panel 1 and the corresponding light-transmitting region 23 in the light-emitting plate 2.

In this embodiment, each imaging pinhole 31 has a limited field-of-view (FOV). The light passing through the respective imaging pinholes 31 form images in the corresponding region of the image sensor 4, and then the images in different regions of the image sensor 4 can be spliced together to form the image of the target object. In this embodiment, the image-side FOV angle of each imaging pinhole 31 is indicated by 2a, the distance between the centers of adjacent imaging pinholes 31 is indicated by d, the distance from the light-sensitive surface of the image sensor 4 to the imaging pinhole is indicated by h. In order to ensure that the imaging of two adjacent imaging pinholes 31 does not overlap with each other on the image sensor, d and h should meet d≥2h tan α.

Figure 5:
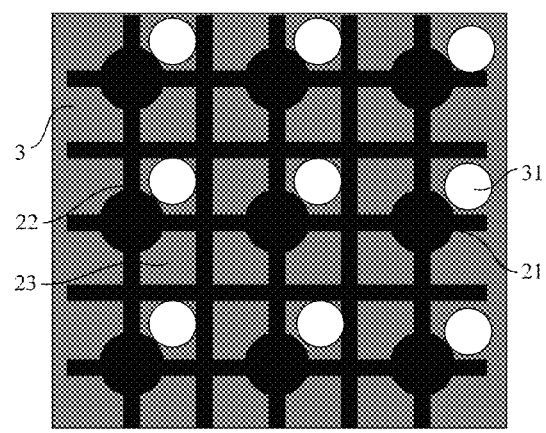
FIG. 5 is a planar schematic structural diagram of a light blocking film shown in the second embodiment.

FIG. 5 is a planar schematic structural diagram of a light blocking film shown in the second embodiment. As shown in FIG. 5, the imaging pinholes 31 in the light blocking film 3 are arranged in a square pattern, and between two adjacent imaging pinholes 31 there are a plurality of light-transmitting regions 23. However, in other embodiments, each light-transmitting region 23 may correspond to one imaging pinhole 31.

Figure 6:
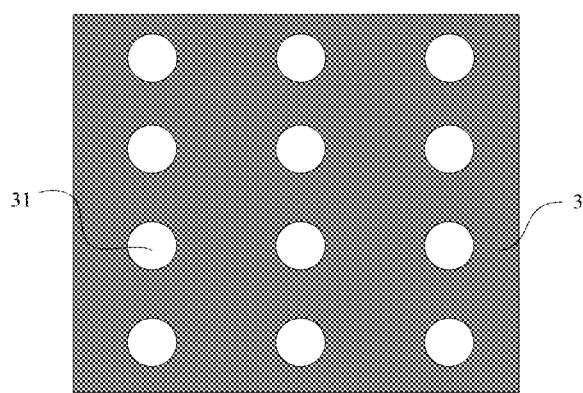
FIG. 6 is a planar schematic structural diagram of another light blocking film shown in the second embodiment.
Figure 7:
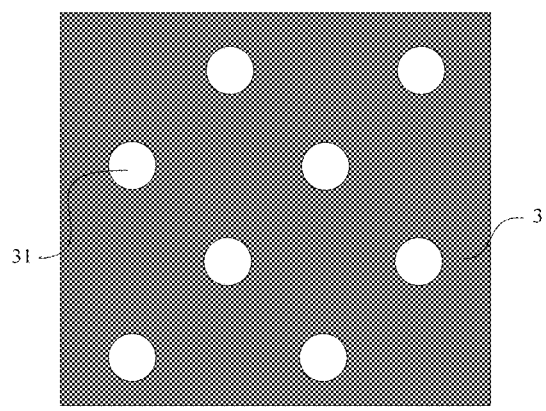
FIG. 7 is a planar schematic structural diagram of another light blocking film shown in the second embodiment.

FIG. 6 and FIG. 7 are planar schematic structural diagrams of the light blocking film in other embodiments. As can be seen from FIG. 6 and FIG. 7, the imaging pinholes 31 in the light blocking film 3 may also be arranged as a rectangle or a diamond pattern. However, the structure of the light blocking film 3 is not limited to the above, and may also be other structures, so long as it can ensure that the distance d between adjacent imaging pinholes 31 and the distance h from the imaging pinhole 31 to the image sensor 4 meet d≥2h tan α.

In this embodiment, the imaging pinhole 31 is preferably a circular hole. In consideration of the manufacture process and the light transmission amount of the pinhole, as well as the definition of pinhole imaging, the diameter of the imaging pinhole 31 is appropriately in a range of 1.0-50.0 um. However, in other embodiments, the imaging pinhole 31 may also be other regular pinholes, such as square hole. Additionally, the area of the light blocking film 3 in this embodiment may be larger than that of the image sensor 4, so as to prevent stray light from being irradiated onto the image sensor 4 via the edge regions.

Third Embodiment

Figure 8:
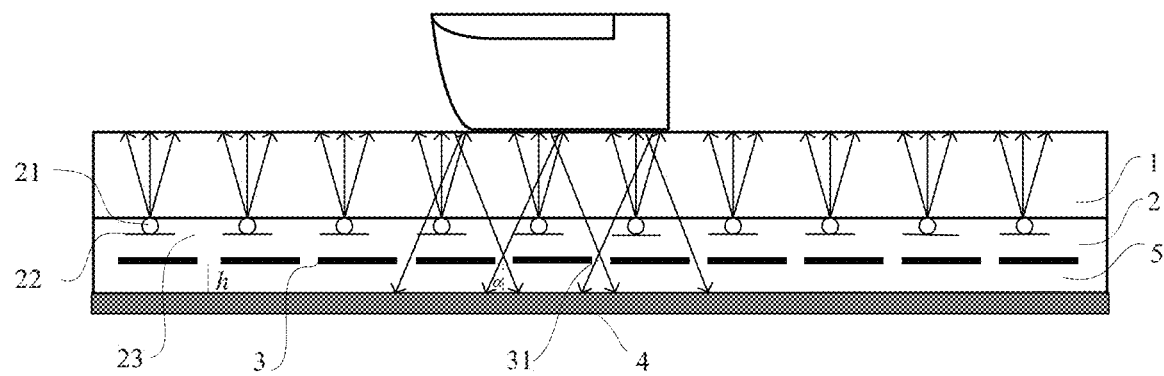
FIG. 8 is a schematic sectional view of the display screen shown in the third embodiment.

FIG. 8 is a schematic sectional view of the display screen shown in a third embodiment. As shown in FIG. 8, the structure of the display screen in the third embodiment is roughly the same as that in the second embodiment, except that a light-transmitting substrate 5 is provided between the light blocking film 3 and the image sensor 4. For the display screen in this embodiment, the light emitted by the light-emitting unit 21 is reflected by a target object on or outside the panel 1, passes through the light path and the light-transmitting substrate 5, and then is irradiated on the image sensor 4. The light-transmitting substrate 5 in this embodiment may support the light-emitting plate 2 and connect the image sensor 4.

Fourth Embodiment

Figure 9:
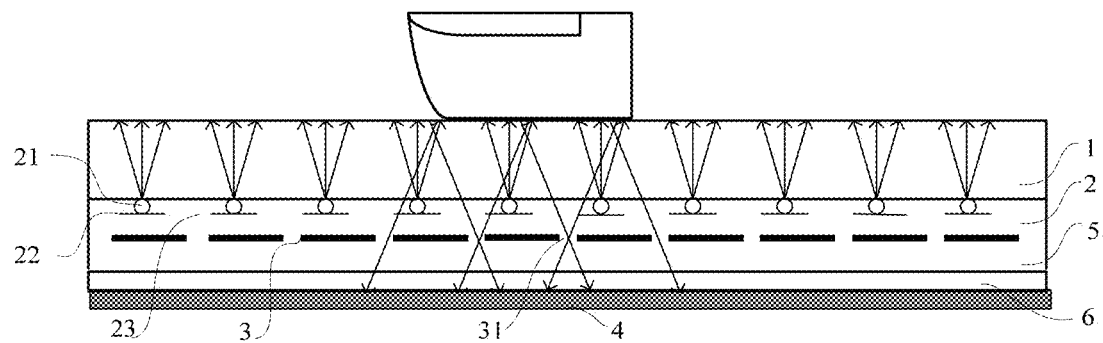
FIG. 9 is a schematic sectional view of the display screen shown in the fourth embodiment.

FIG. 9 is a schematic sectional view of the display screen shown in a fourth embodiment. As shown in FIG. 9, the structure of the display screen in the fourth embodiment is roughly the same as that in the third embodiment, except that a low-refractive index light-transmitting layer 6 is further provided between the light-transmitting substrate 5 and the image sensor 4, the light emitted by the light-emitting unit 21 is reflected by a target object on or outside the panel, passes through the light path, the light-transmitting substrate and the low-refractive index light-transmitting layer 6, and then is irradiated on the image sensor 4. Preferably, the low-refractive index light-transmitting layer 6 in this embodiment is an air layer or a vacuum layer.

Fifth Embodiment

Figure 10:
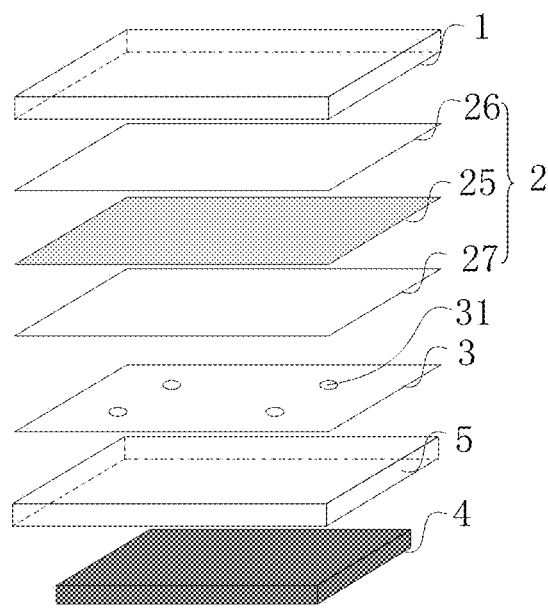
FIG. 10 is a schematic exploded view of the display screen shown in the fifth embodiment.
Figure 11:
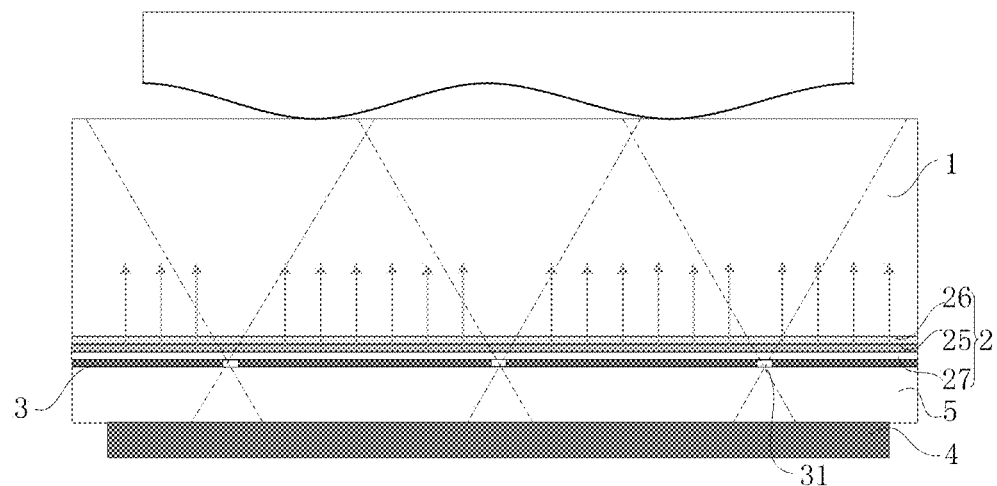
FIG. 11 is a schematic sectional view of the display screen shown in the fifth embodiment.

FIG. 10 is a schematic exploded view of the display screen shown in a fifth embodiment, and FIG. 11 is a schematic sectional view of the display screen shown in the fifth embodiment. As shown in FIG. 10 and FIG. 11, the structure of the display screen in the fifth embodiment is roughly the same as that in the third embodiment, except that the light-emitting plate 2 is a plane light-emitting plate which is light-transmissive; a light path is formed by the panel 1, the light-emitting plate 2, the corresponding imaging pinhole 31 and the light-transmitting substrate 5. A part of light projected by the light-emitting plate 2 toward the panel 1 side is reflected by a target object on or outside the panel 1, and then is irradiated onto a corresponding position of the image sensor 4 through the above light path.

In this embodiment, the light-emitting plate 2 is manufactured employing an OLED technology. As shown in FIG. 10 and FIG. 11, the plane light-emitting plate includes an organic material layer 25, a first electrode layer 26 provided between the organic material layer 25 and the panel 1, and a second electrode layer 27 provided between the organic material layer 25 and the light blocking film 3. When a drive voltage is applied between the first electrode layer 26 and the second electrode layer 27, the organic material layer 25 emits light. In this embodiment, the organic material layer 25, the first electrode layer 26 and the second electrode layer 27 in the light-emitting plate 2 may all be light-transmissive or semi-light transmissive, so that the light reflected by the target object may pass through the light-emitting plate 2 and enter the corresponding imaging pinhole 31. In other embodiments, only the region of the second electrode layer 27 corresponding to the FOV angle of the imaging pinhole 31 is light-transmissive or semi-light transmissive.

In this embodiment, the first electrode layer 26 is a cathode layer, and the second electrode layer 27 is an anode layer; however, in other embodiments, the first electrode layer 26 may be an anode layer, and the second electrode layer 27 may be a cathode layer, which does not affect the realization of the light-emitting function of the organic material layer 25.

In other embodiments, if the electrode layer (a cathode layer or an anode layer) adjacent to the light blocking film is light-tight, the electrode layer may act as a light blocking film, that is, imaging pinholes can be manufactured directly in the electrode, without providing a separate light blocking film.

Additionally, in other embodiments, the light-emitting plate 2 may also be a plane light-emitting plate of other structures or mechanisms, so long as it has the previous light-emitting and light-transmitting functions.

As shown in FIG. 10 and FIG. 11, in this embodiment, a light-transmitting substrate 5 is provided between the light blocking film 3 and the image sensor 4; referring to the above embodiments, the light-transmitting substrate 5 between the light blocking film 3 and the image sensor 4 may be removed, or a low-refractive index light-transmitting layer 6 may be provided between the light-transmitting substrate 5 and the image sensor 4.

As shown in FIG. 10, in this embodiment, the light blocking film 3 is provided with a plurality of imaging pinholes 31. In other embodiments, only one imaging pinhole 31 may be provided in the light blocking film 3.

Sixth Embodiment

Figure 12:
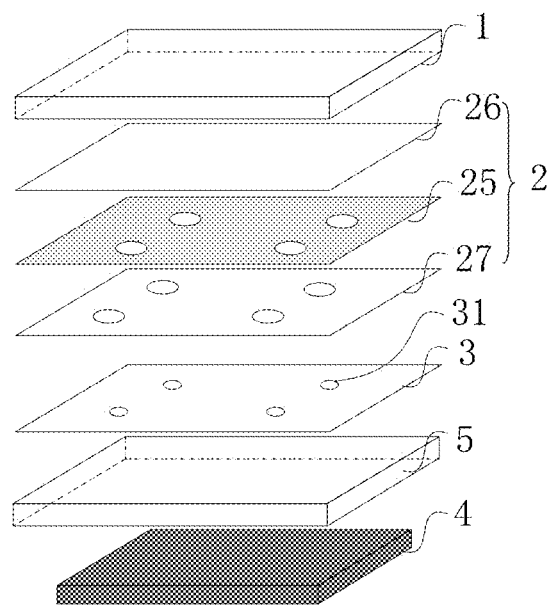
FIG. 12 is a schematic exploded view of the display screen shown in the sixth embodiment.
Figure 13:
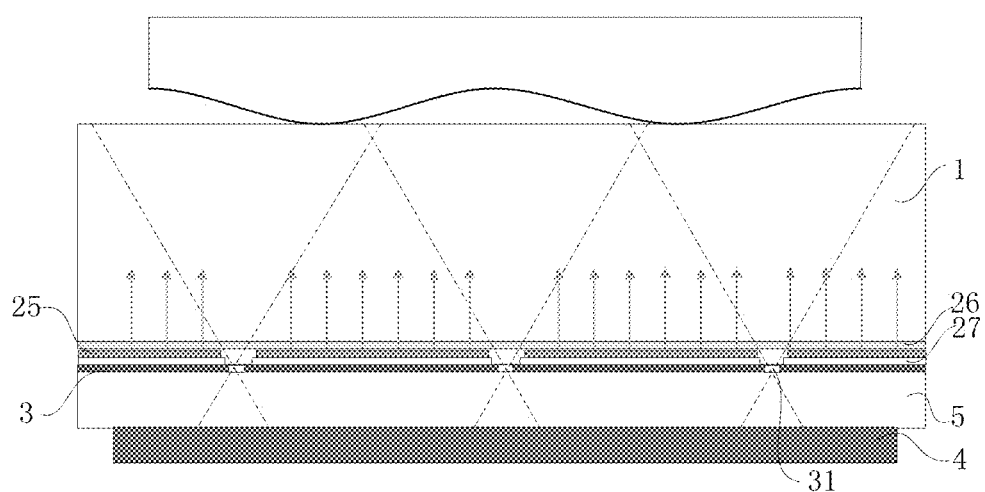
FIG. 13 is a schematic sectional view of the display screen shown in the sixth embodiment.

FIG. 12 is a schematic exploded view of the display screen shown in a sixth embodiment, and FIG. 13 is a schematic sectional view of the display screen shown in the sixth embodiment. As shown in FIG. 12 and FIG. 13, the structure of the display screen in this embodiment is roughly the same as that in the fifth embodiment, except that the region of the light-emitting plate 2 corresponding to the FOV angle of the imaging pinhole 31 does not emit light. As shown in FIG. 12, in this embodiment, the regions of the organic material layer 25 and the second electrode layer 27 corresponding to the FOV angle of the imaging pinhole 31 are etched to form the corresponding non-light-emitting regions. In other embodiments, the regions of the organic material layer 25, the first electrode layer 26 and the second electrode layer 27 corresponding to the FOV angle of the imaging pinhole 31 may be etched to form the corresponding non-light-emitting regions.

It may be noted that, because the region, corresponding to the FOV angle of the imaging pinhole 31, of the light-emitting plate 2 does not emit light, it may be avoided that the light emitted by the organic material layer 25 from directly passing through the imaging pinhole 31 to be irradiated onto the image sensor 4 and to produce interference noise.

Seventh Embodiment

Figure 14:
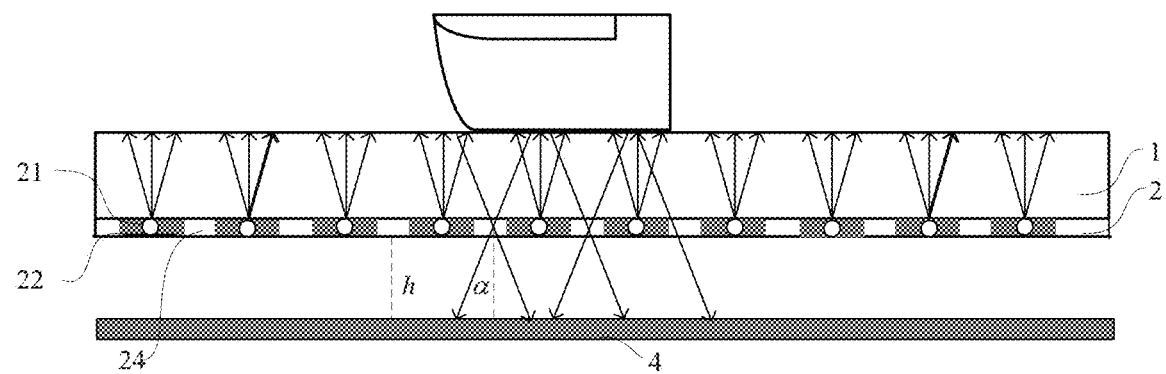
FIG. 14 is a schematic sectional view of the display screen shown in the seventh embodiment.

FIG. 14 is a schematic sectional view of the display screen shown in a seventh embodiment. As shown in FIG. 14, the display screen in this embodiment includes a panel 1, a light-emitting plate 2 and an image sensor 4; the panel 1, the light-emitting plate 2 and the image sensor 4 are stacked sequentially. Wherein, the panel is a light-transmitting plate; the light-emitting plate has light-emitting units 21, the light emitted by the light-emitting unit 21 projects in directions toward the panel 1; the side of the light-emitting plate 2 facing the image sensor is light-tight but is provided with imaging pinholes 24. A light path is formed by the panel 1 and the imaging pinhole 24.

After the light emitted by the light-emitting unit 21 projects in directions toward the panel 1, if there is a target object on an upper side of the panel 1, a part of the light will re-enter the panel 1 after being reflected by the target object, and then be irradiated onto the image sensor through the corresponding light path.

In this embodiment, the image-side FOV angle of the imaging pinhole 24 is indicated by 2a, and the distance between the centers of adjacent imaging pinholes 24 is indicated by d; the distance from the light-sensitive surface of the image sensor 4 to the imaging pinhole 24 is indicated by h. In order to ensure that the imaging regions of two adjacent imaging pinholes 24 on the image sensor 4 do not overlap with each other, d and h should meet d≥2h tan α.

In this embodiment, the area of the light-emitting plate 2 is preferably larger than that of the image sensor 4. Additionally, in consideration of the manufacture process and the light transmission amount of the imaging pinhole, as well as the definition of pinhole imaging, the diameter of the imaging pinhole 24 is appropriately in a range of 1.0-50.0 um.

Eighth Embodiment

Figure 15:
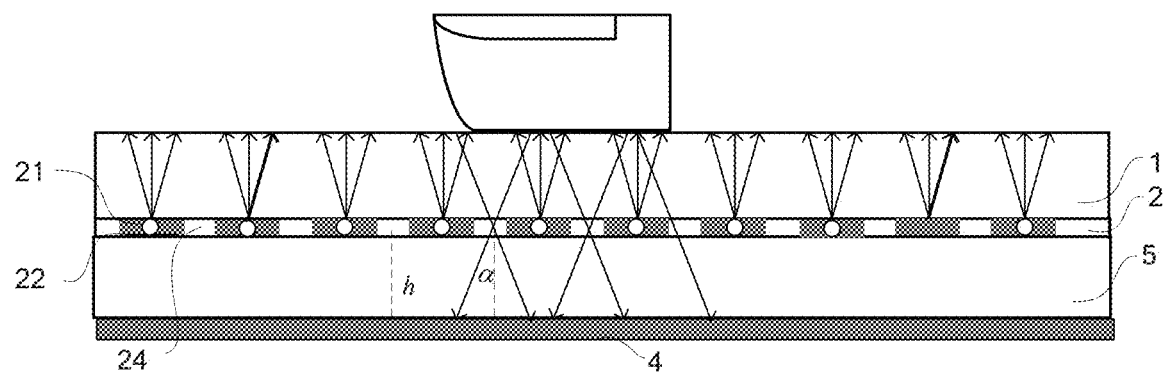
FIG. 15 is a schematic sectional view of the display screen shown in the eighth embodiment.

FIG. 15 is a schematic sectional view of the display screen shown in an eighth embodiment. As shown in FIG. 15, the structure of the display screen in the eighth embodiment is roughly the same as that in the fifth embodiment, except that a light-transmitting substrate 5 is provided between the light-emitting plate 2 and the image sensor 4. By employing the display screen in this embodiment, the light emitted by the light-emitting unit 21 is reflected by a target object on or outside the panel 1, passes through the light path and the light-transmitting substrate 5, and then is irradiated onto the image sensor 4.

Ninth Embodiment

Figure 16:
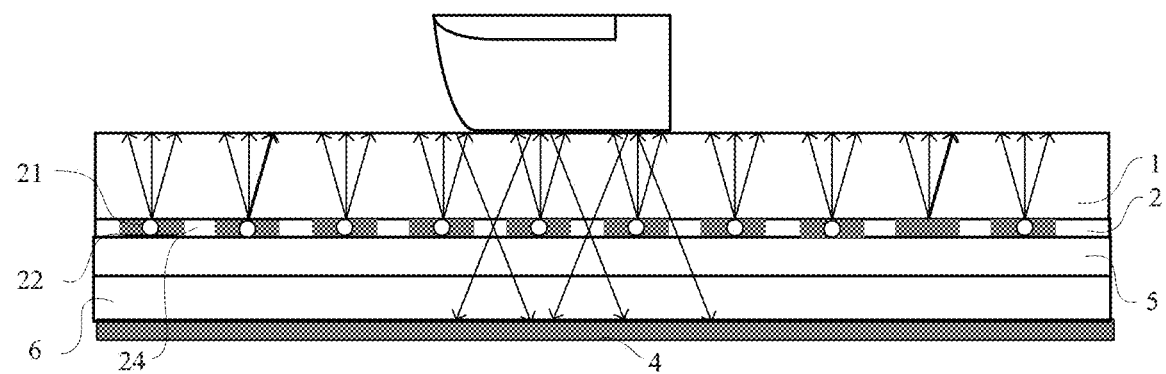
FIG. 16 is a schematic sectional view of the display screen shown in the ninth embodiment.

FIG. 16 is a schematic sectional view of the display screen shown in a ninth embodiment. As shown in FIG. 16, the structure of the display screen in the ninth embodiment is roughly the same as that in the eighth embodiment, except that a low-refractive index light-transmitting layer 6 is further provided between the light-transmitting substrate 5 and the image sensor 4, the light emitted by the light-emitting unit 21 is reflected by a target object on or outside the panel 1, passes through the light path, the light-transmitting substrate 5 and the low-refractive index light-transmitting layer 6, and then is irradiated onto the image sensor 4. Preferably, the low-refractive index light-transmitting layer 6 in this embodiment is an air layer or a vacuum layer.

Tenth Embodiment

Figure 17:
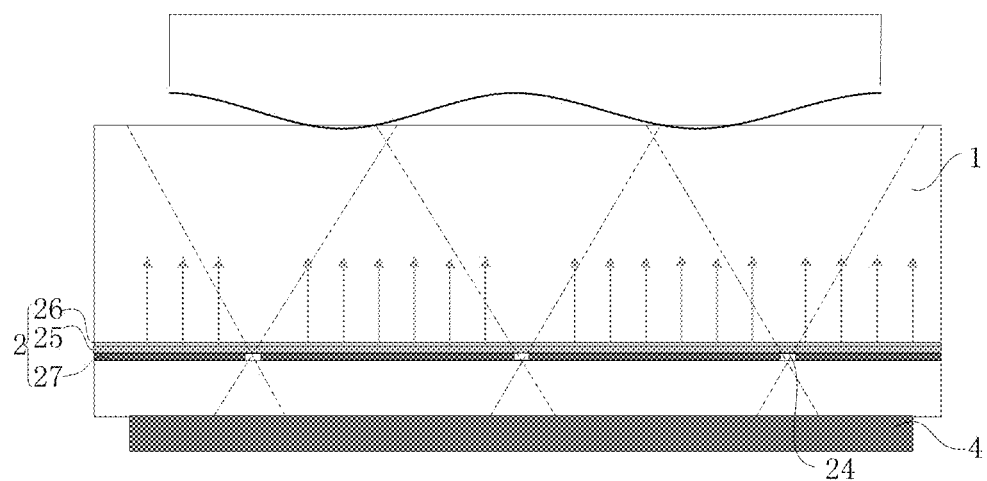
FIG. 17 is a schematic sectional view of the display screen shown in the tenth embodiment.

FIG. 17 is a schematic sectional view of the display screen shown in a tenth embodiment. The structure of the display screen shown in the tenth embodiment is roughly the same as that in the seventh embodiment, except that the structure of the light-emitting plate 2 is different from that in the seventh embodiment. As shown in FIG. 17, the light-emitting plate 2 in this embodiment is replaced with the plane light-emitting plate in the fifth embodiment. However, in other embodiments, the light-emitting plate 2 may also be a plane light-emitting plate of other structures or mechanisms, so long as it has the previous light-emitting and light-transmitting functions.

Referring to the eighth embodiment and the ninth embodiment, as an improvement of the structure of the display screen in this embodiment, a light-transmitting substrate 5 may be provided between the light-emitting plate 2 and the image sensor 4, or a low-refractive index light-transmitting layer 6 may be further provided between the light-transmitting substrate 5 and the image sensor 4.

Referring to the sixth embodiment, as an improvement of the structure of the display screen in this embodiment, the region of the light-emitting plate 2 corresponding to the FOV angle of the imaging pinhole 24 may not emit light in other embodiments, thereby preventing the light emitted by the light-emitting plate 2 from directly passing through the imaging pinhole 24 and being irradiated onto the image sensor 4 to form interference noise.

Eleventh Embodiment

Figure 18:
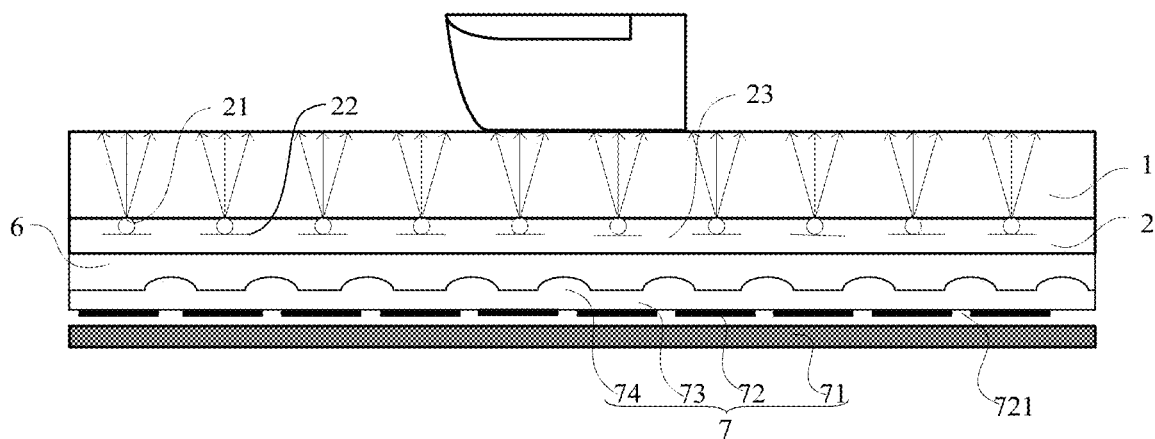
FIG. 18 is a schematic sectional view of the display screen shown in the eleventh embodiment.

FIG. 18 is a schematic sectional view of the display screen shown in the eleventh embodiment. The display screen in this embodiment includes a panel 1 and a light-emitting plate 2 that are stacked sequentially; the light-emitting plate 2 has light-emitting units 21 and light-transmitting regions 23, and the light emitted by the light-emitting units 21 projects in directions toward the panel 1. Additionally, the display screen in this embodiment further has a narrow-FOV-pixel image sensor 7 provided on one side of the light-emitting plate 2. The light emitted by the light-emitting unit 21 is reflected by a target object on or outside the panel 1, and then is irradiated onto an imaging pixel 71 of the narrow-FOV-pixel image sensor 7 through the light path formed by the panel 1 and the light-transmitting region 23.

As shown in FIG. 18, a light blocking film 72, a transparent material layer 73 and a microlens 74 are provided sequentially on one side of the imaging pixel 71 of the narrow-FOV-pixel image sensor 7 in this embodiment. The light blocking film 72 has light-transmitting pinholes 721 corresponding to the respective microlenses. The FOV angle of the imaging pixel 71 is constrained by the microlens 74, the transparent material layer 73 and the light-transmitting pinhole 721 as less than 15°. Additionally, a low-refractive index light-transmitting layer 6 is provided between the microlenses 74 and the light-emitting plate 2, and the light emitted by the light-emitting unit 21 is reflected by a target object on or outside the panel 1, successively passes through the light path, the low-refractive index light-transmitting layer 6, the microlens 74, the transparent material layer 73 and the light-transmitting pinhole 721, and then is irradiated onto the imaging pixel 71.

Referring to the fifth embodiment and the sixth embodiment, the light-emitting plate 2 in this embodiment may also be replaced with the plane light-emitting plate in the fifth embodiment or the sixth embodiment.

Twelfth Embodiment

Figure 19:
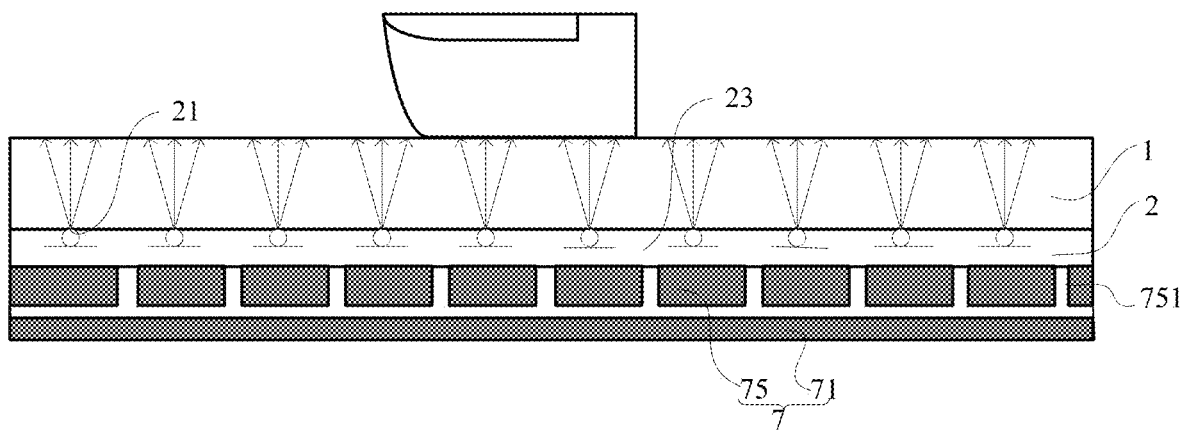
FIG. 19 is a schematic sectional view of the display screen shown in the twelfth embodiment.

FIG. 19 a schematic sectional view of the display screen shown in a twelfth embodiment. The narrow-FOV-pixel image sensor 7 in this embodiment has a light-blocking plate 75, and the light-blocking plate 75 is provided with light-transmitting holes 751. The thickness x of the light-blocking plate 75 and the diameter y of the light-transmitting hole 751 meet $$2\arctan\frac{y}{x} \leq 15°.$$

The light emitted by the light-emitting unit 21 is reflected by a target object on or outside the panel 1 and then is irradiated onto the imaging pixel after successively passing through the light path and the light-transmitting hole 751. Additionally, a low-refractive index light-transmitting layer 6 may be, or may not be, provided in this embodiment.

Referring to the fifth embodiment and the sixth embodiment, the light-emitting plate 2 in this embodiment may also be replaced with the plane light-emitting plate provided in the fifth embodiment or the sixth embodiment.

Thirteenth Embodiment

Figure 20:
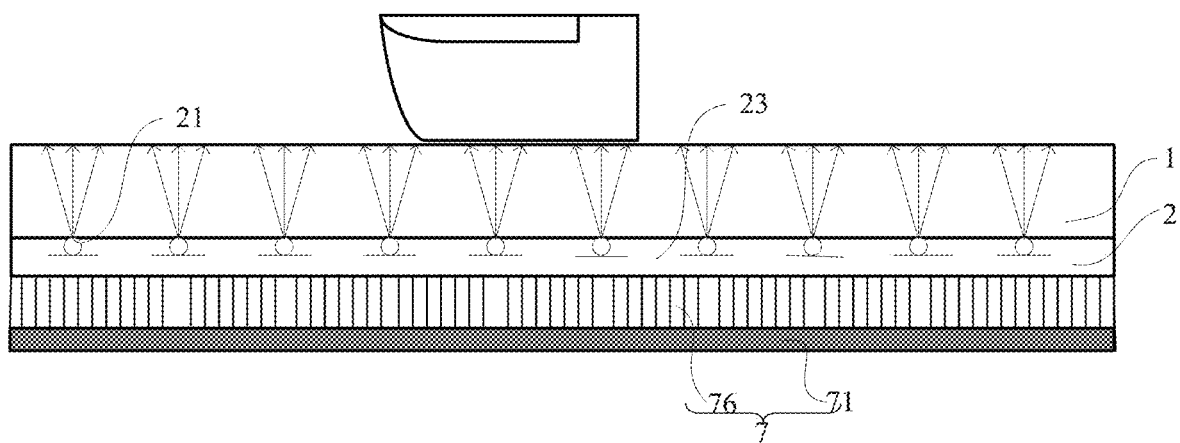
FIG. 20 is a schematic sectional view of the display screen shown in the thirteenth embodiment.

FIG. 20 is a schematic sectional view of the display screen shown in a thirteenth embodiment. The structure of the display screen in this embodiment is roughly the same as that in the eleventh embodiment, except that the narrow-FOV-pixel image sensor 7 includes light guide fibers 76, an endface receiving angle of which is less than 15°. The light guide fibers 76 are provided between the light-emitting plate 2 and the imaging pixels 71. The light emitted by the light-emitting unit 21 is reflected by a target object on or outside the panel 1, and then is irradiated on the image sensor 4 after successively passing through the light path and the light guide fiber 76.

Referring to the fifth embodiment and the sixth embodiment, the light-emitting plate 2 in this embodiment may also be replaced with the plane light-emitting plate provided in the fifth embodiment or the sixth embodiment.

The display screens according to the embodiments of the present application have been in detail described above. The principles and implementations of the present application are described with specific embodiments herein, and the descriptions of the above embodiments are only provided to help understanding the core concept of the present application. Within the principle of the present application, all other embodiments obtained by one of ordinary skill in the art without creative efforts will fall in the protection scope of the present application.

What is claimed is:

1. A display screen comprising: a panel, a light-emitting plate, a light blocking film and an image sensor that are stacked; wherein
   the light blocking film is provided with a light-transmitting imaging pinhole;
   the light-emitting plate is provided with a plurality of light-emitting units and an opaque circuit network for driving the plurality of light-emitting units, the light-emitting plate being separated into a plurality of light-transmitting regions by the circuit network, and a light path being formed by the panel, the light-transmitting region corresponding to a position of the imaging pinhole and the imaging pinhole; or, the light-emitting plate is a plane light-emitting plate which is light transmissive, a light path being formed by the panel, the plane light-emitting plate and the imaging pinhole;
   the panel, the light-emitting plate, the light blocking film and the image sensor are arranged so that a reflected part, by a target object located on or outside the panel, of light projected by the light-emitting plate toward the panel is transmissible onto the image sensor through the light path, and
   wherein the display screen further comprises a light-transmitting substrate provided between the light blocking film and the image sensor, and a low-refractive index light-transmitting layer provided between the light-transmitting substrate and the image sensor.

2. The display screen according to claim 1, wherein a region of the light-emitting plate corresponding to a field-of view (FOV) angle of the imaging pinhole does not emit light.

3. A display screen comprising: a panel, a light-emitting plate, a light blocking film and an image sensor that are stacked, wherein
   the light blocking film is provided with a light-transmitting imaging pinhole;
   the light-emitting plate is provided with a plurality of light-emitting units and an opaque circuit network for driving the plurality of light-emitting units, the light-emitting plate being separated into a plurality of light-transmitting regions by the circuit network, and a light path being formed by the panel, the light-transmitting region corresponding to a position of the imaging pinhole and the imaging pinhole; or, the light-emitting plate is a plane light-emitting plate which is light transmissive, a light path being formed by the panel, the plane light-emitting plate and the imaging pinhole;
   the panel, the light-emitting plate, the light blocking film and the image sensor are arranged so that a reflected part, by a target object located on or outside the panel, of light projected by the light-emitting plate toward the panel is transmissible onto the image sensor through the light path;
   the light blocking film is provided with a plurality of the imaging pinholes; and
   an image-side FOV angle of the imaging pinhole is $2\alpha$, a distance between the centers of adjacent imaging pinholes is d, and a distance from a imaging surface of the image sensor to the light blocking film is h, where $d \geq 2h \tan \alpha$.

4. A display screen, comprising:
   a panel, a light-emitting plate and an image sensor that are stacked; wherein
   a side of the light-emitting plate facing the image sensor is provided with a lighttight material, an imaging pinhole which is light transmissive being provided on the lighttight materials; and
   the panel, the light-emitting plate, the light blocking film and the image sensor are arranged so that a reflected a part, by a target object located on or outside the panel, of light projected by the light-emitting plate toward the panel is transmissible onto the image sensor through a light path formed by the panel and the imaging pinhole; and
   the lighttight material includes an opaque electrode layer, an imaging pinhole which is light transmissive being provided on the opaque electrode layer.

5. The display screen according to claim 4, wherein
   a region of the light-emitting plate corresponding to an FOV angle of the imaging pinhole does not emit light.

6. A display screen, comprising:
   a panel, a light-emitting plate and an image sensor that are stacked; wherein
   a side of the light-emitting plate facing the image sensor is provided with a lighttight material, an imaging pinhole which is light transmissive being provided on the lighttight materials;
   the panel, the light-emitting plate, the light blocking film and the image sensor are arranged so that a reflected part, by a target object located on or outside the panel, of light projected by the light-emitting plate toward the panel is transmissible onto the image sensor through a light path formed by the panel and the imaging pinhole, and
   wherein the display screen further comprises a light-transmitting substrate provided between the light-emitting plate and the image sensor, and a low-refractive index light-transmitting layer provided between the light-transmitting substrate and the image sensor.

7. A display screen, comprising:
   a panel, a light-emitting plate and an image sensor that are stacked; wherein
   a side of the light-emitting plate facing the image sensor is provided with a lighttight material, an imaging pinhole which is light transmissive being provided on the lighttight materials;
   the panel, the light-emitting plate, the light blocking film and the image sensor are arranged so that a reflected part, by a target object located on or outside the panel, of light projected by the light-emitting plate toward the panel is transmissible onto the image sensor through a light path formed by the panel and the imaging pinhole;

a light blocking film is formed by the lighttight material and is provided with a plurality of the imaging pinholes; and an image-side FOV angle of the imaging pinhole is 2α, a distance between the centers of adjacent imaging pinholes is d, and a distance from a imaging surface of the image sensor to the light blocking film is h, where d≥2h tan α.

8. A display screen comprising a panel, a light-emitting plate, and a narrow-FOV-pixel image sensor which is provided at a side of the light-emitting plate, the narrow-FOV-pixel image sensor includes imaging pixels with a FOV angle less than 15°, wherein the light-emitting plate is provided with a plurality of light-emitting units and an opaque circuit network for driving the plurality of light-emitting units, the light-emitting plate being separated into a plurality of light-transmitting regions by the circuit network, and a light path being formed by the panel and the light-transmitting region; or, the light-emitting plate is a plane light-emitting plate which is light transmissive, a light path being formed by the panel and the plane light-emitting plate; and the panel, the light-emitting plate, and the narrow-FOV-pixel image sensor are arranged so that a reflected part, by a target object located on or outside the panel, of light projected by the light-emitting plate toward the panel is transmissible onto the narrow-FOV pixel image sensor through the light path.

9. The display screen according to claim 8, wherein the narrow-FOV-pixel image sensor includes a light blocking film, a transparent material layer and microlenses that are provided sequentially on a side of the imaging pixels, the light blocking film is provided with light-transmitting pinholes corresponding to positions of the microlenses, and the FOV angle of the imaging pixel is constrained as less than 15° by the microlens, the transparent material layer and the light-transmitting pinhole;

a low-refractive index light-transmitting layer with a refractive index lower than that of the microlenses is provided between the microlenses and the light-emitting plate; and light emitted by the light-emitting plate is reflected by a target object located on or outside the panel, passes through the light path, the low-refractive index light-transmitting layer, the microlens, the transparent material layer and the light-transmitting pinhole successively, and then is irradiated onto the imaging pixels.

10. The display screen according to claim 8, wherein the narrow-FOV-pixel image sensor has a light-blocking plate provided between the light-emitting plate and the imaging pixels, the light-blocking plate is provided with light-transmitting holes, a thickness x of the light-blocking plate and a diameter Y of the light-transmitting hole meet $$2\arctan\frac{y}{x} \leq 15°;$$

and light emitted by the light-emitting plate is reflected by a target object located on or outside the panel, passes through the light path and the light-transmitting hole successively, and then is irradiated onto the imaging pixels.

11. The display screen according to claim 8, wherein the narrow-FOV-pixel image sensor further comprises light guide fibers provided between the light-emitting plate and the imaging pixels, an endface receiving angle of the light guide fiber being less than 15°; and light emitted by the light-emitting plate is reflected by a target object located on or outside the panel, passes through the light path and the light guide fiber successively, and then is irradiated onto the imaging pixel.

* * * * *